United States Patent
Kaneko et al.

(10) Patent No.: US 6,891,163 B2
(45) Date of Patent: May 10, 2005

(54) ARRAY TYPE X-RAY DETECTION APPARATUS

(75) Inventors: Katsuyuki Kaneko, Moriguchi (JP); Hiroshi Tsutsui, Yawata (JP); Shinichi Nakahara, Ikeda (JP); Yasuhiko Shinkaji, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 196 days.

(21) Appl. No.: 10/148,829

(22) PCT Filed: Dec. 6, 2000

(86) PCT No.: PCT/JP00/08611

§ 371 (c)(1),
(2), (4) Date: Oct. 2, 2002

(87) PCT Pub. No.: WO01/42813

PCT Pub. Date: Jun. 14, 2001

(65) Prior Publication Data

US 2003/0053586 A1 Mar. 20, 2003

(30) Foreign Application Priority Data

Dec. 7, 1999 (JP) .......................................... 11-348099
Dec. 7, 1999 (JP) .......................................... 11-348100

(51) Int. Cl.⁷ .............................. G01T 1/24; H01L 31/08
(52) U.S. Cl. ................................................. 250/370.09
(58) Field of Search .................................... 250/370.09

(56) References Cited

U.S. PATENT DOCUMENTS 4,689,487 A * 8/1987 Nishiki et al. .......... 250/361 R
4,910,158 A * 3/1990 Anderson .................... 438/519
5,852,296 A * 12/1998 Tsukamoto et al. .... 250/370.09
6,243,441 B1 * 6/2001 Zur ........................... 378/98.8

FOREIGN PATENT DOCUMENTS

| JP | 06-121791 | 5/1994 |
|---|---|---|
| JP | 10-10237 | 1/1998 |
| JP | 10-506230 | 6/1998 |
| WO | 96/03773 | 2/1996 |

OTHER PUBLICATIONS

Japanese language search report for PCT/JP00/08611 dated Apr. 3, 2001, Not a publication.
English translation of Form PCT/ISA/210, Not a publication.

* cited by examiner

*Primary Examiner*—Constantine Hannaher
(74) *Attorney, Agent, or Firm*—RatnerPrestia

(57) ABSTRACT

In order to prevent destruction of a read gate by excessive storage of charge without any addition or change to the manufacturing process, the array type X-ray detection apparatus using a direct conversion system, which directly converts irradiation X-rays to charge, provides each pixel cell with a sensor section for converting X-rays to an amount of charge according to the amount of X-rays, a charge collecting electrode for storing the charge generated, a read gate for transferring the stored charge to an external read amplifier and a MIS diode using a TFT. A clamp signal is applied to one end of the MIS diode. The read gate and MIS diode are formed in the same manufacturing process. Since the amount of charge stored in the charge collecting electrode is clamped to the amount of charge corresponding to the clamp signal voltage by the MIS diode, the read gate is not destroyed even with excessive X-ray irradiation. Furthermore, instead of the MIS diode, a cutoff voltage control circuit and a cutoff gate using a TFT connected to the cutoff voltage control circuit are provided. When the output of the charge storage capacitor exceeds a cutoff voltage, the cutoff gate interrupts the inflow of charge to the charge storage capacitor to suppress further increase of output, thus preventing the read gate from being destroyed.

9 Claims, 11 Drawing Sheets

ARRAY TYPE X-RAY DETECTION APPARATUS

This application is a U.S. National Phase Application of PCT International Application No. PCT/JP00/08611.

TECHNICAL FIELD

The present invention relates to a planar type X-ray detection apparatus for use in a medical X-ray diagnostic apparatus, and more particularly, to an X-ray detection apparatus in which X-ray detectors are integrated in a two-dimensional array using a thin-film transistor (TFT) manufacturing technology.

BACKGROUND ART

For radiographic tests, a method of obtaining two-dimensional images called an "X-ray planar detector" whereby electrons generated by a two-dimensional array of X-ray sensors are electronically swept and measured using switching elements is conceived, instead of a conventional radiographic method using X-ray films. In this apparatus, storing electrons and switching elements make it possible to manufacture capacitors all together using thin-film transistor (TFT) manufacturing process used to manufacture liquid crystal displays, etc.

With respect to the method of obtaining an amount of charge corresponding to an amount of X-ray, the following two methods are conceived for the X-ray planar detector.

A first method is called an "indirect method", whereby X-rays are converted to light by a fluorescent body (scintillator) which converts X-rays to light and then this light is converted to photoelectrons by a photodiode to be stored.

A second method is called a "direct method" whereby a semiconductor for directly converting X-rays to light is used and electric charge output from the semiconductor is stored in a capacitor.

Of these methods, the indirect method can manufacture a fluorescent body which converts X-rays to light and a TFT panel made up of a photodiode, capacitor and read gate separately because there is no electric connection between the fluorescent body and TFT panel, therefore, the indirect method has an advantage of providing an easy way of manufacturing. On the other hand, the indirect method converts X-rays to light once and therefore has a disadvantage of causing deterioration of conversion efficiency and deterioration of resolution caused by scattering of light.

In contrast, the direct method needs to insert a high purity semiconductor conversion material with little leakage current between a voltage application electrode (normally, the surface side of a detector) and a charge collecting electrode (may also serve as one side of a capacitor), and therefore the direct method is said to require a high-level technology from both aspects of creation of materials and manufacturing. However, since the direct method intrinsically has a high efficiency in conversion from X-ray to charge and allows the charge generated by direct conversion from X-rays to be collected by the charge collecting electrode located right below without being scattered by an electric field applied between the voltage application electrode and charge collecting electrode, the direct method has a great advantage of obtaining high resolution, clear image.

With an X-ray planar detector using the direct method, an amount of charge proportional to the amount of incident X-rays is generated inside a semiconductor conversion layer, and it is necessary to apply a relatively large voltage to the voltage application electrode to collect this charge. For this reason, a large amount of charge is stored in a cell which has a large amount of incident X-rays, and as a result, there is a possibility that an extremely high voltage exceeding this withstand voltage may be applied to the capacitor and read gate.

As a technology to protect the capacitor and read gate from such a danger, a method of inserting a Zener diode between the charge collecting electrode and grounding potential (ground), which turns to be conducted at a predetermined voltage not greater than a breakdown voltage of these elements, is known (see Japanese Patent Laid-Open No. 10-10237).

An outline of an X-ray sensor array using this conventional technology will be explained using FIG. 10 and FIG. 11. FIG. 10 is a block diagram of an X-ray sensor array made up of 4 pixels×4 pixels. In the figure, a pixel cell 103 corresponds to a 1-pixel X-ray sensor. Each pixel cell 103 is constructed of a read gate 100, a Zener diode 101 and a charge collecting electrode 102 which also servers as a charge storage capacitor. Though not shown in the figure, an X-ray semiconductor conversion material is laid on the surface of the charge collecting electrode, where X-rays are converted to charge and stored in the charge collecting electrode 102. The charge stored in the charge collecting electrode is read under the control of a gate driver 104, sent to a read amplifier 105 and converted to an electric signal. This signal is scanned by a multiplexer 106 and output to the outside successively.

FIG. 11 shows an equivalent circuit diagram of one pixel cell and the read amplifier 105 connected to this pixel cell. In the same figure, reference numeral 110 denotes a charge collecting power supply to collect charge generated in the X-ray conversion semiconductor layer into the charge collecting electrode 102, 111 denotes an equivalent capacitance (sensor section capacitance) of the X-ray conversion section, 112 denotes a storage electrode capacitance corresponding to the charge collecting electrode 102, 101 denotes a Zener diode and 100 denotes a read gate. Furthermore, reference numeral 114 denotes an OP amplifier and 115 denotes a feedback capacitance and the charge collected through the read gate 100 by these components into the storage electrode capacitance 112 is converted to a voltage signal, which becomes an output signal.

One end of the Zener diode 101 of each cell is grounded and the breakdown voltage of this Zener diode is set to a value lower than the breakdown voltage of the read gate 100.

On the other hand, the potential on the read amplifier side of the read gate 100 is almost fixed to approximately the grounding potential and a voltage approximately equivalent to the voltage applied to the storage charge capacitance 112 is applied between the source and drain of the read gate 100.

Irradiation of X-rays increases charge stored in the storage electrode capacitance 112 and when the breakdown voltage of the Zener diode 101 is exceeded, the charge collected from the X-ray sensor section thereafter is passed to the ground as a breakdown current of the Zener diode. For this reason, the voltage applied between the source and drain of the read gate 100 is always suppressed to the breakdown voltage of the Zener diode 101 or below preventing the read gate from being broken by excessive irradiation of X-rays.

The X-ray sensor array according to the conventional technology is as described above, but using the Zener diode to clamp the voltage applied to the read gate requires an extra process of forming a PN junction to be added to a normal TFT manufacturing process. Moreover, the breakdown voltage of the Zener diode is determined by the concentration of impurities of the semiconductors forming the junction (to be exact, higher concentration of the two), and therefore controlling the breakdown voltage to the source-drain withstand voltage of the read gate or below requires the concentration of impurities to be controlled, which further requires an extra process.

DISCLOSURE OF THE INVENTION

The present invention has been implemented to solve the disadvantages described above and it is an object of the present invention to provide an array type X-ray detection apparatus capable of preventing destruction of the read gate due to excessive irradiation of X-rays with a simple configuration without changing a standard TFT manufacturing process used for a TFT liquid crystal panel, etc.

To achieve the above object, one aspect of the present invention is an array type X-ray detection apparatus comprising:

a plurality of X-ray dose detection devices arranged in a two-dimensional array;

reading means of reading from said plurality of X-ray dose detection devices; and potential setting means of setting a predetermined reference voltage to protect said plurality of X-ray dose detection devices and/or said reading means, wherein said plurality of X-ray dose detection devices comprises:

charge converting means of converting incident X-rays to charge;

charge storing means of storing said charge;

charge transferring means of transferring the charge stored in said charge storing means to said reading means; and output limiting means of practically limiting the output potential produced by the charge stored in said charge storing means to said predetermined reference potential or below, Another aspect of the present invention is the array type X-ray detection apparatus according to the present invention mentioned above, wherein said output limiting means comprises a clamp voltage source whose potential is set by said potential setting means and a PN junction diode.

Still another aspect of the present invention is the array type X-ray detection apparatus comprising:

a plurality of X-ray dose detection devices arranged in a two-dimensional array;

reading means of reading from said plurality of X-ray dose detection devices; and potential setting means of setting a predetermined reference voltage to protect said plurality of X-ray dose detection devices and/or said reading means, wherein said plurality of X-ray dose detection devices comprises:

charge converting means of converting incident X-rays to charge;

charge storing means of storing said charge;

charge transferring means of transferring the charge stored in said charge storing means to said reading means; and output limiting means of practically limiting the output potential produced by the charge stored in said charge storing means to said predetermined reference potential or below, wherein said output limiting means comprises a clamp voltage source whose potential is set from said potential setting means and a MIS diode connecting the gate terminal and source terminal of a first MIS transistor.

Yet still another aspect of the present invention is the array type X-ray detection apparatus mentioned above, wherein said charge transferring means comprises a second MIS transistor and said first MIS transistor and said second MIS transistor are formed in the same process.

Still yet another aspect of the present invention is the array type X-ray detection apparatus, wherein said first MIS transistor has a multi-gate structure.

A further aspect of the present invention is the array type X-ray detection apparatus comprising:

a plurality of X-ray dose detection devices arranged in a two-dimensional array;

reading means of reading from said plurality of X-ray dose detection devices; and potential setting means of setting a predetermined reference voltage to protect said plurality of X-ray dose detection devices and/or said reading means, wherein said plurality of X-ray dose detection devices comprises:

charge converting means of converting incident X-rays to charge;

charge storing means of storing said charge;

charge transferring means of transferring the charge stored in said charge storing means to said reading means; and output limiting means of practically limiting the output potential produced by the charge stored in said charge storing means to said predetermined reference potential or below, and wherein said output limiting means is a cutoff switch placed between said charge converting means and said charge storing means, said charge transferring means transfers charge between said cutoff switch and said charge storing means, and said cutoff switch opens and closes in such a way that the output potential produced by the charge stored in said charge storing means is practically limited to a predetermined reference potential or below.

A still further aspect of the present invention is the array type X-ray detection apparatus, wherein said cutoff switch is a third MIS transistor and the potential of the gate of said third MIS transistor is set from said potential setting means.

This makes it possible to prevent the charge transferring means from being destroyed by excessive charge-storing in the charge storing means.

A yet further aspect of the present invention is the array type X-ray detection apparatus, wherein said charge transferring means is a fourth MIS transistor and said fourth transistor and said third MIS transistor are formed in the same process.

This makes it possible to form the cutoff switch without a change in the manufacturing process of the apparatus or addition of a special process.

A still yet further aspect of the present invention is the array type X-ray detection apparatus, wherein said third MIS transistor has a multi-gate structure.

This makes it possible to reduce the possibility that the cutoff switch itself will be destroyed by charge generated by the charge converting means after cutting off the cutoff switch.

An additional aspect of the present invention is the array type X-ray detection apparatus comprising:

a plurality of X-ray dose detection devices arranged in a two-dimensional array;

reading means of reading from said plurality of X-ray dose detection devices; and potential setting means of setting a predetermined reference voltage to protect said plurality of X-ray dose detection devices and/or said reading means, wherein said plurality of X-ray dose detection devices comprises:

charge converting means of converting incident X-rays to charge;

charge storing means of storing said charge;

charge transferring means of transferring the charge stored in said charge storing means to said reading means; and output limiting means of practically limiting the output potential produced by the charge stored in said charge storing means to said predetermined reference potential or below, and wherein a charge conversion material making up said charge converting means includes at least metal iodide.

A still additional aspect of the present invention is the array type X-ray detection apparatus, wherein the charge conversion material making up said charge converting means includes at least metal iodide.

This makes it possible to reduce the charge collecting voltage to be applied to the charge converting means and reduce the possibility that the cutoff switch itself will be destroyed by charge generated by the charge converting means. When a MIS transistor is used in particular, metal iodide such as lead iodide displays excellent properties.

BEST MODE FOR CARRYING OUT THE INVENTION

With reference now to the attached drawings, embodiments of the present invention will be explained below.
(Embodiment 1)

Figure 1:
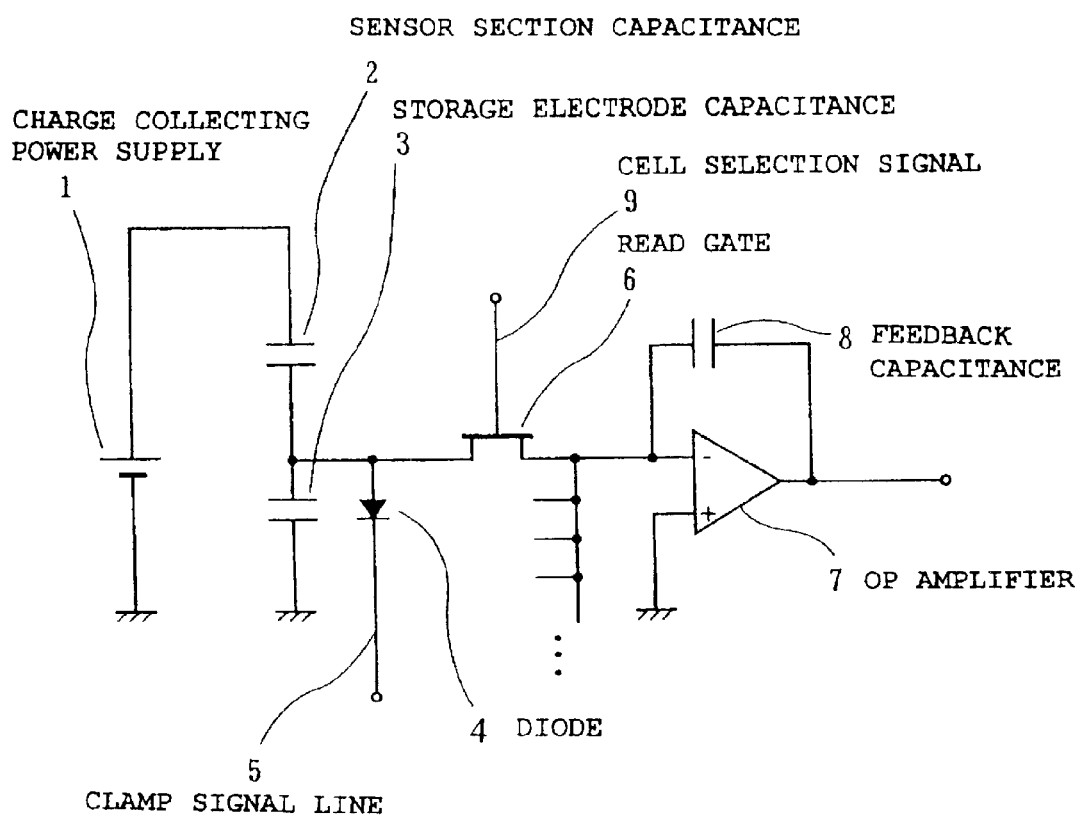
FIG. 1 is an equivalent circuit diagram of a pixel cell and a read amplifier according to Embodiment 1 of the present invention.
Figure 11:
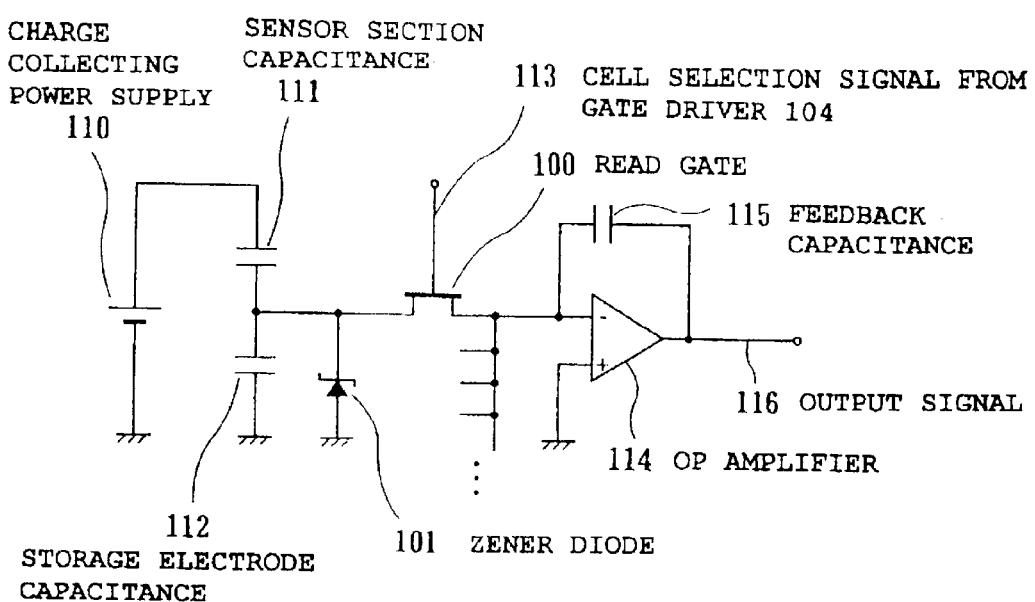
FIG. 11 is an equivalent circuit diagram of a pixel cell and a read amplifier according to the conventional technology.
Description of Symbols 1 CHARGE COLLECTING POWER SUPPLY
2 SENSOR SECTION CAPACITANCE
3 STORAGE ELECTRODE CAPACITANCE
4 DIODE
5 CLAMP SIGNAL LINE
6, 31 READ GATE
7 OP AMPLIFIER
8 FEEDBACK CAPACITANCE
9 CELL SELECTION SIGNAL
10, 32 MIS TRANSISTOR
20, 21, 22 MULTI-GATE MIS TRANSISTOR
30 PIXEL CELL
33 CHARGE COLLECTING ELECTRODE
34 GATE DRIVER
35 READ AMPLIFIER
36 MULTIPLEXER
37 CLAMP VOLTAGE CONTROL CIRCUIT
41 CUTOFF GATE
42 CHARGE STORAGE CAPACITOR
43 CHARGE COLLECTING ELECTRODE
44 CUTOFF VOLTAGE CONTROL CIRCUIT
45 CHARGE COLLECTING VOLTAGE APPLICATION ELECTRODE
46 X-RAY CONVERSION MATERIAL
47 CUTOFF CONTROL SIGNAL
50 X-RAY SENSOR

FIG. 1 shows an equivalent circuit diagram of a pixel cell and a read amplifier (circuit diagram corresponding to FIG. 11 in the conventional example) of an array type X-ray detection apparatus according to Embodiment 1 of the present invention.

Figure 10:
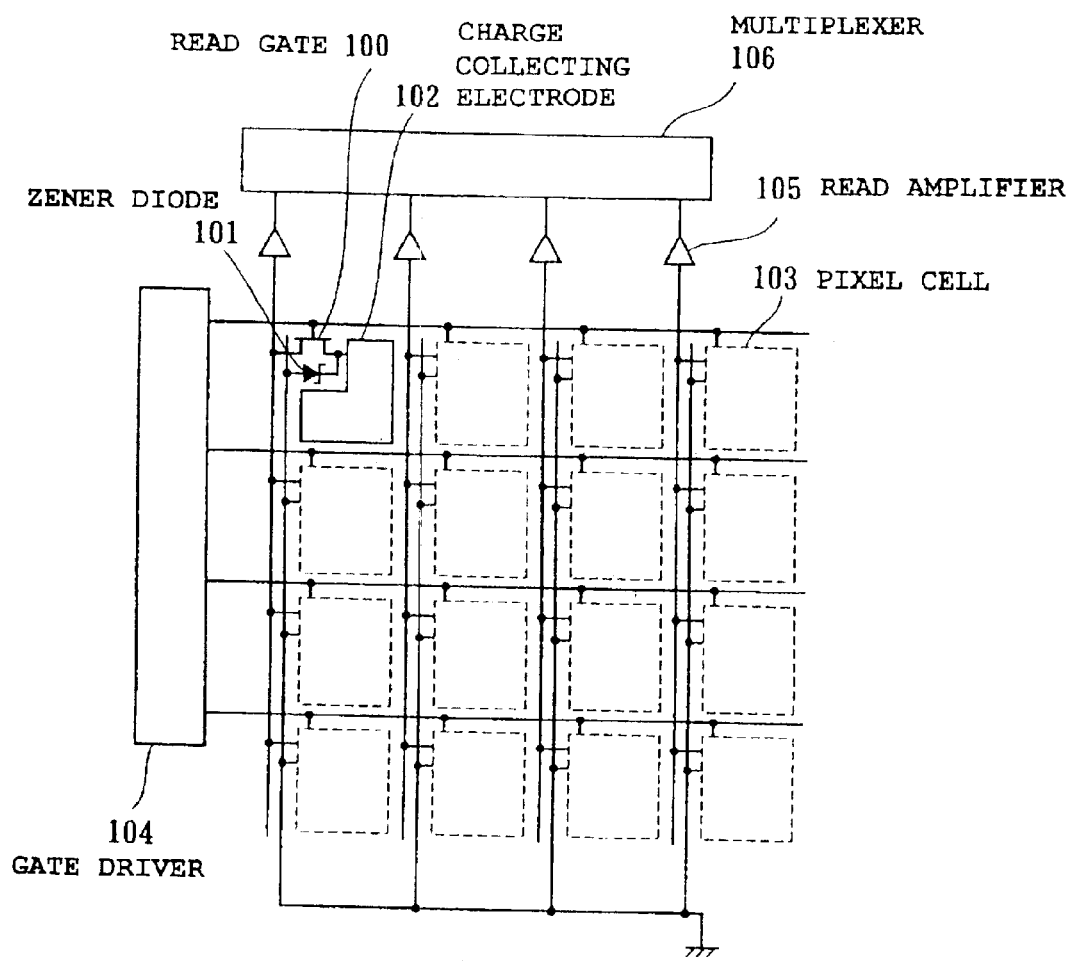
FIG. 10 is a block diagram of an X-ray sensor array according to a conventional technology.

A configuration (block diagram corresponding to FIG. 10 in the conventional example) and basic operation of the X-ray detection apparatus in this embodiment will be described later.

FIG. 1 is an equivalent circuit diagram of a pixel cell and a read amplifier connected to this pixel cell.

In FIG. 1, reference numeral 1 denotes a charge collecting power supply to collect charge generated in an X-ray conversion semiconductor layer into the charge collecting electrode; 2, an equivalent capacitance (sensor section capacitance) of an X-ray conversion section; 3, a storage electrode capacitance corresponding to the charge collecting electrode 2; 4, a diode; 5, a clamp signal line; 6, a read gate.

Moreover, reference numeral 7 denotes an OP amplifier and 8 denotes a feedback capacitance, and the charge collected through the read gate 6 by these components into the storage electrode capacitance 3 is converted to a voltage signal, which becomes an output signal.

A cell selection signal is applied to the gate of the read gate 6.

One end of the diode 4 of each pixel cell is connected to the clamp signal line 5 and a clamp value of the voltage applied to the storage electrode capacitance 3, or to be exact, a voltage obtained by subtracting a threshold voltage of the diode, for example, approximately 0.7 V from this clamp value is applied to this signal line 5. This clamp value is normally set to a value lower than the breakdown voltage of the read gate 6.

On the other hand, the potential on the read amplifier side of the read gate 6 is fixed to almost the grounding potential, and as a result, a voltage almost equivalent to the voltage applied to the storage charge capacitance 3 is applied between the source and drain of the read gate 6.

When the charge stored in the storage electrode capacitance 3 increases with irradiation of X-rays and reaches a point in excess of the clamp voltage determined by the diode 4 and clamp signal line 5, the charge collected from the X-ray sensor section after this time at which this clamp voltage is exceeded flows into the clamp signal line 5 as a forward current of the diode 4. Thus, the voltage applied between the source and drain of the read gate 6 is always suppressed to this clamp voltage or less, preventing the read gate 6 from being destroyed by excessive irradiation of X-rays.

Thus, this embodiment can clamp the output potential generated by the charge stored in the storage electrode capacitance 3 of each pixel of the array type X-ray detection apparatus at a certain voltage using the diode and clamp signal line and can further make this clamp voltage variable by changing the voltage applied to the clamp signal line 5. This makes it possible to set the clamp voltage to an optimal value which will not damage the read gate 6 according to X-ray irradiation conditions, photographic condition and TFT process manufacturing conditions, etc.

(Embodiment 2)

Figure 2:
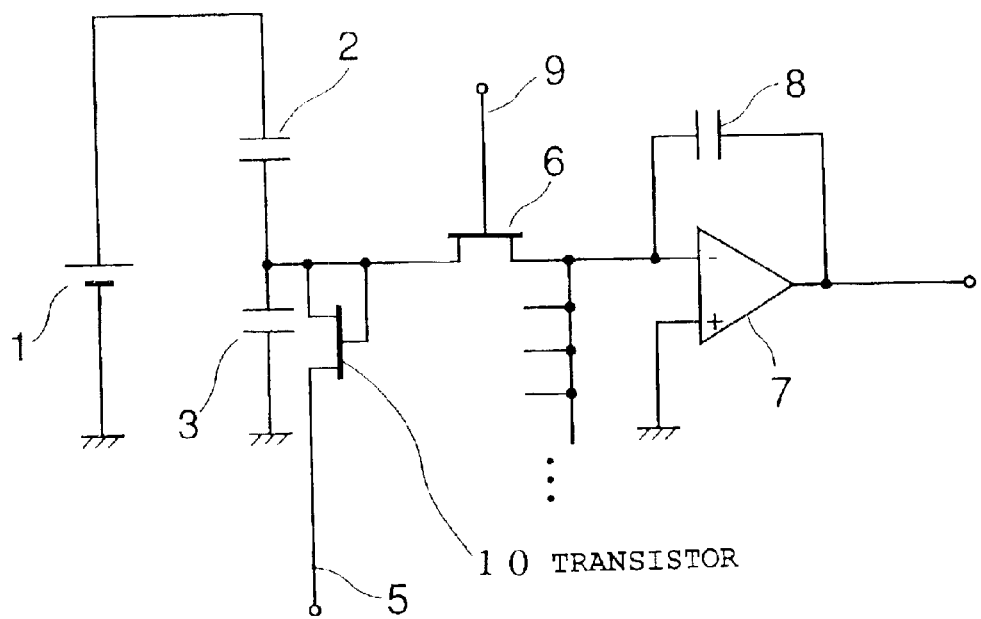
FIG. 2 is an equivalent circuit diagram of a pixel cell and a read amplifier according to Embodiment 2 of the present invention.

FIG. 2 shows an equivalent circuit diagram of a pixel cell and a read amplifier of an array type X-ray detection apparatus according to Embodiment 2 of the present invention. A configuration and basic operation of the X-ray detection apparatus in this embodiment will be described later, but they are basically the same as those in the conventional example.

As opposed to Embodiment 1 in which the diode 4 constitutes the output controlling means, this embodiment uses a MIS diode, which is a MIS transistor whose gate and drain are short-circuited, as the output controlling means, and the rest of the configuration is the same as that of Embodiment 1.

The MIS transistor (TFT) 10 whose gate and drain are short-circuited has almost the same current/voltage characteristic as a diode whose transistor Vt is set to a threshold voltage. Thus, this embodiment can also has almost the same effect as that of Embodiment 1, that is, this embodiment can freely set the clamp voltage according to various conditions.

Furthermore, this MIS transistor 10 can have the same structure as that of the read gate 6, and therefore the MIS transistor 10 can be created in the same manufacturing process, and by using this effect, it is possible to avoid the necessity to particularly make a change or addition to a process when manufacturing the array type X-ray detection apparatus.

(Embodiment 3)

Figure 3:
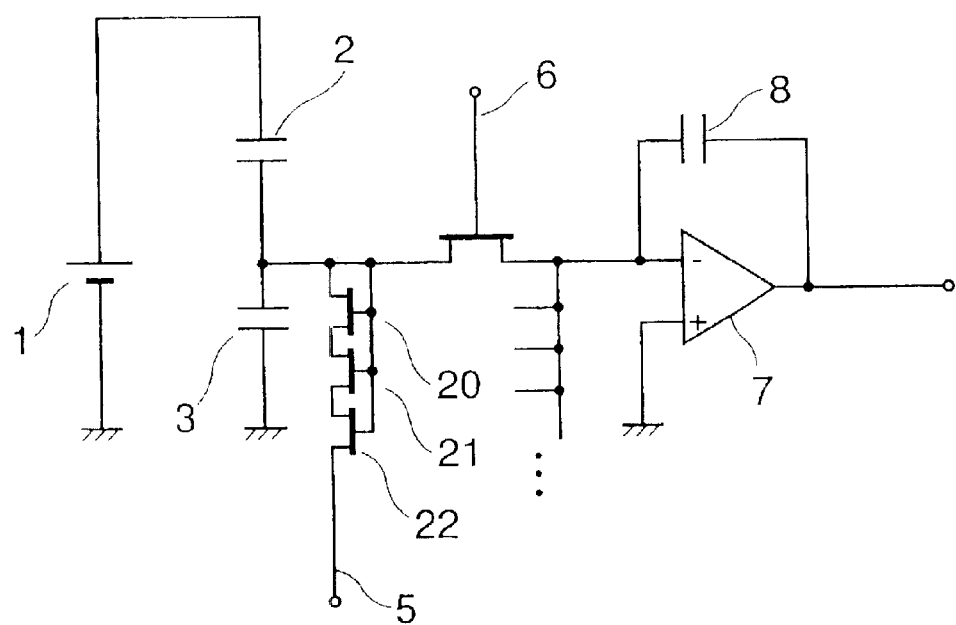
FIG. 3 is an equivalent circuit diagram of a pixel cell and a read amplifier according to Embodiment 3 of the present invention.

FIG. 3 shows an equivalent circuit diagram of a pixel cell and a read amplifier of an array type X-ray detection apparatus according to Embodiment 3 of the present invention. A configuration and basic operation of the X-ray detection apparatus in this embodiment will be described later, but they are basically the same as those in the conventional example.

As opposed to Embodiment 2 in which the MIS diode (MIS transistor) 10 having a single gate constitutes the output controlling means, this embodiment shows MIS diodes 20, 21 and 22 forming multi-gates constitute the output controlling means and the rest of the configuration is the same as that of Embodiment 1 or Embodiment 2.

The multi-gate MIS diodes whose gate and drain are short-circuited display almost the same characteristic as a normal single gate MIS diode, but its leakage current of the channel decreases drastically because the voltage applied between the source and drain decreases. Generally, a minimum amount of charge stored in each pixel cell of the X-ray detection apparatus is not greater than 10,000, and therefore widening the dynamic range of X-ray detection requires the leakage current from each node connected to the storage electrode capacitance 3 to be reduced. This embodiment reduces leakage current by constructing the MIS diodes with multi-gates.

Furthermore, in the process of manufacturing an amorphous TFT with a reverse stagger structure used for a liquid crystal display, etc., it is possible to construct the TFT with multi-gates with only a minimal amount of increase in the area without additional wiring, by alternately forming source (or drain) areas on silicon right above the gate electrode. Also in this case, like Embodiment 2, the multi-gate MIS diodes 20, 21 and 22 can basically have the same structure as that of the read gate 6 and can therefore be created in the same manufacturing process and there is no need to make a change or addition to the process. It is also possible to have effects similar to those of Embodiments 1 and 2, that is, this embodiment can freely set the clamp voltage according to various conditions.

Figure 4:
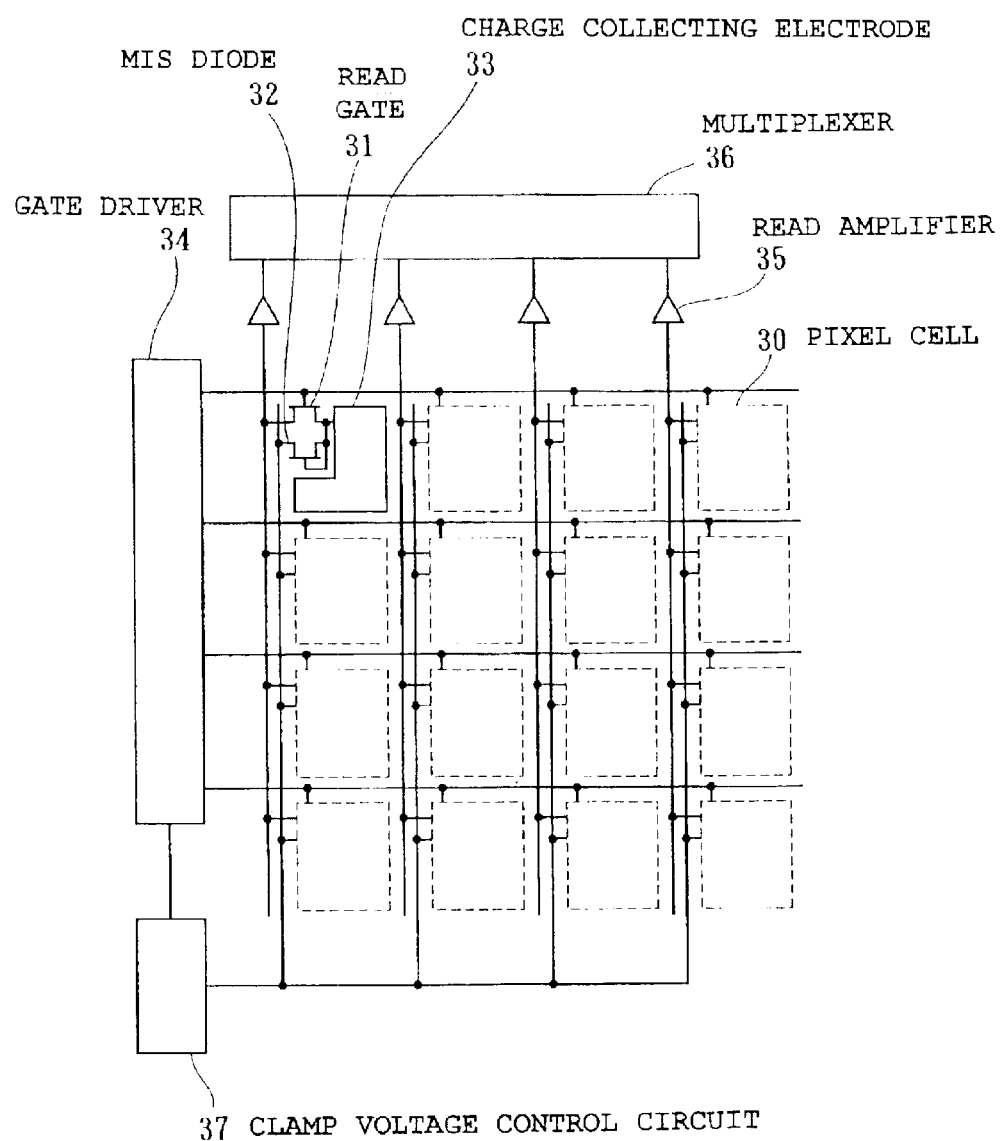
FIG. 4 is a block diagram of an X-ray sensor array according to Embodiments 1 to 3 of the present invention.
Figure 5:
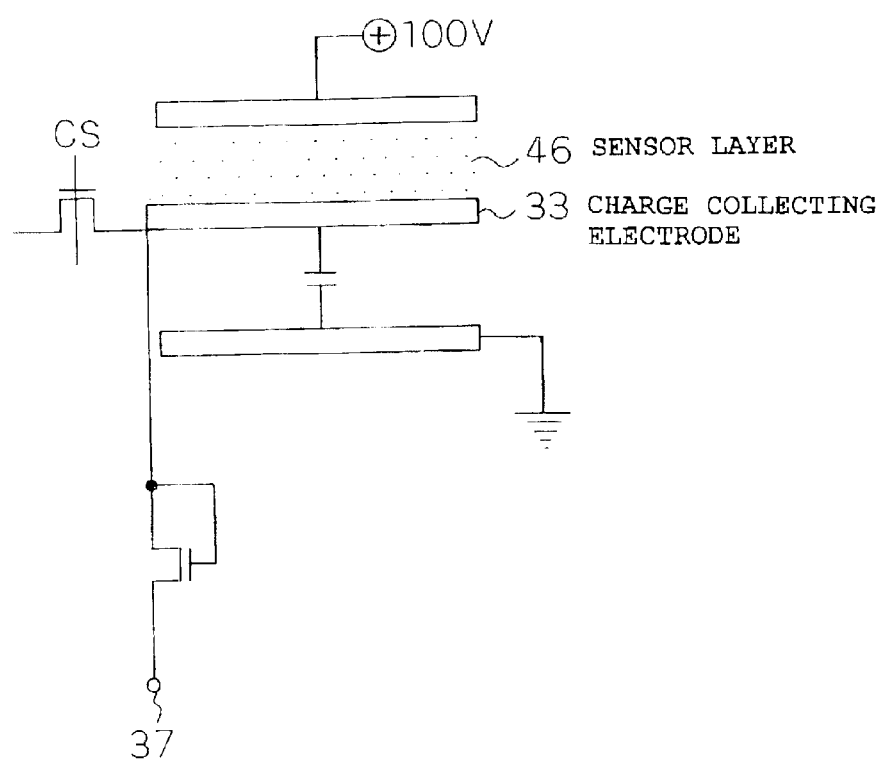
FIG. 5 is a partial sectional view of the X-ray sensor array according to the embodiment in FIG. 4.

Here, FIG. 4 shows a block diagram of an X-ray sensor array made up of 4 pixels×4 pixels in Embodiment 2. FIG. 5 is a sectional view thereof. In FIG. 4, a pixel cell 30 corresponds to a 1-pixel X-ray sensor. Each pixel cell 30 is constructed of a read gate 31, a MIS diode 32 made up of a TFT, a charge collecting electrode 33 which also serves as a charge storage capacitor. Though not shown in the figure, a layer of X-ray semiconductor conversion material is formed on the charge collecting electrode 33, and X-rays are converted to charge in this layer and stored in the charge collecting electrode 33.

The charge stored in the charge collecting electrode 33 is read under the control of a gate driver 34, sent to a read amplifier 35 and converted to an electric signal. This signal is scanned by a multiplexer 36 and output to the outside successively.

One end of the MIS diode of each pixel cell is connected to a clamp voltage control circuit 37 and a clamp voltage suited to the photographic condition and manufacturing condition of the apparatus is supplied to each cell. The X-ray sensor array in Embodiment 1 or 3 also has the same configuration as this. sensor array in Embodiment 1 or 3 also has the same configuration as this.

In the case where the X-ray conversion material making up the X-ray sensor is lead iodide ($PbI_2$), a voltage as low as no more than 100 V needs to be applied to a charge collecting power supply 1 to make it possible to collect the charge generated. In the case of selenium, for example, a voltage as high as 1000 V needs to be applied.

Since the withstand voltage between the source and drain of a TFT gate manufactured in the process used for a liquid crystal display, etc. normally ranges from several tens to 100 V, it is possible to operate the read gate 2 with a voltage not greater than a breakdown voltage when the charge collecting power supply 1 is set to about 100 V and the potential of the clamp signal line 5 is set to about 50 V in Embodiments 1 and 2.

As the X-ray conversion material, not only lead iodide described above but also mercury iodide can be used and it is preferable to use metal iodide. Particularly, a combination with a MIS transistor is preferable.

(Embodiment 4)

An array type X-ray detection apparatus according to Embodiment 4 of the present invention will be explained using FIG. 6 and FIG. 8.

Figure 6:
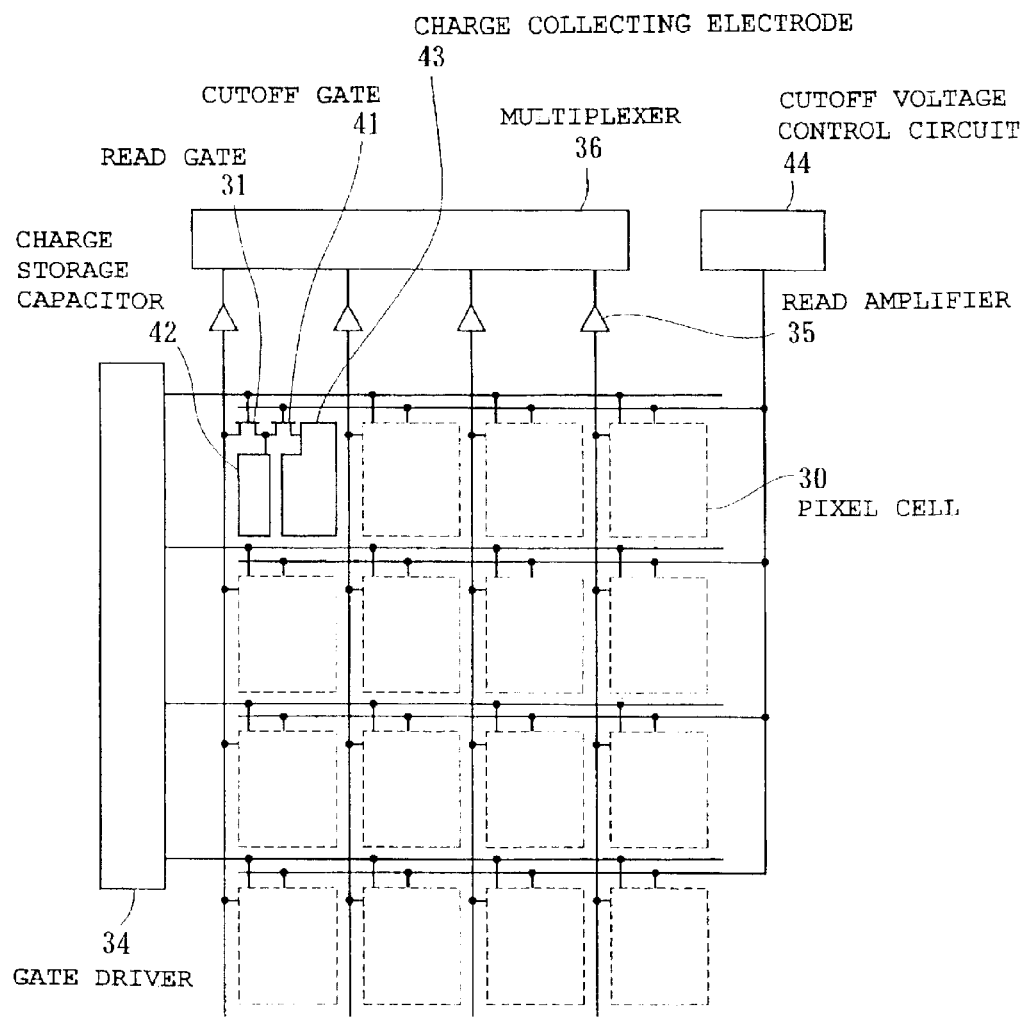
FIG. 6 is a block diagram of the X-ray sensor array according to Embodiment 4 of the present invention.
Figure 7:
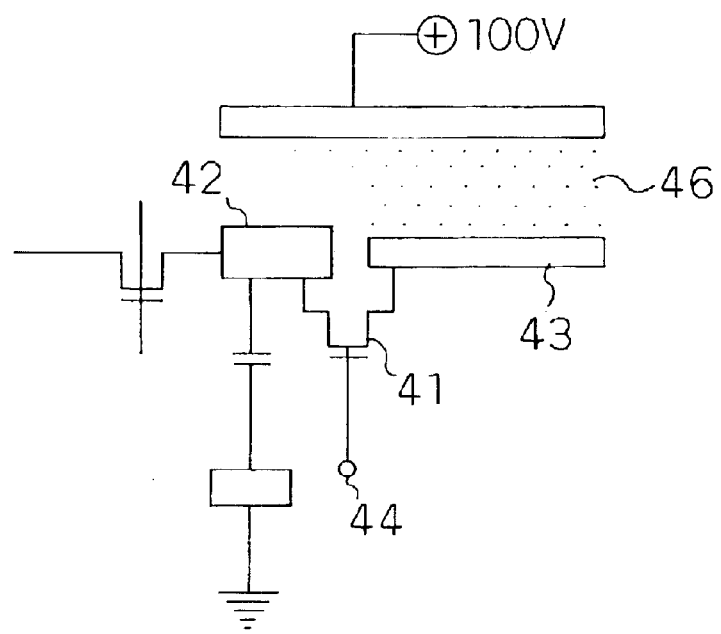
FIG. 7 is a partial sectional view of the X-ray sensor array according to the embodiment in FIG. 6.

FIG. 6 shows a block diagram of an X-ray sensor array made up of 4 pixels×4 pixels. In FIG. 6, a pixel cell 30 corresponds to a 1-pixel X-ray sensor. FIG. 7 is a sectional view thereof. Each pixel cell 30 is constructed of a read gate 31, a cutoff gate 41, a charge storage capacitor 42 and a charge collecting electrode 43. Though not shown in the figure, an X-ray conversion material and a charge collecting voltage application electrode are laid on the surface of the charge collecting electrode, inside which X-rays reach the charge collecting electrode 43 after having been converted to charge.

The charge arriving at the charge collecting electrode passes through the cutoff gate 41 and is stored in the charge storage capacitor 42, read after a certain lapse of time under the control of the gate driver 34, sent to the read amplifier 35 and converted to an electric signal. This signal is scanned by a multiplexer 36 and output to the outside successively.

Figure 8:
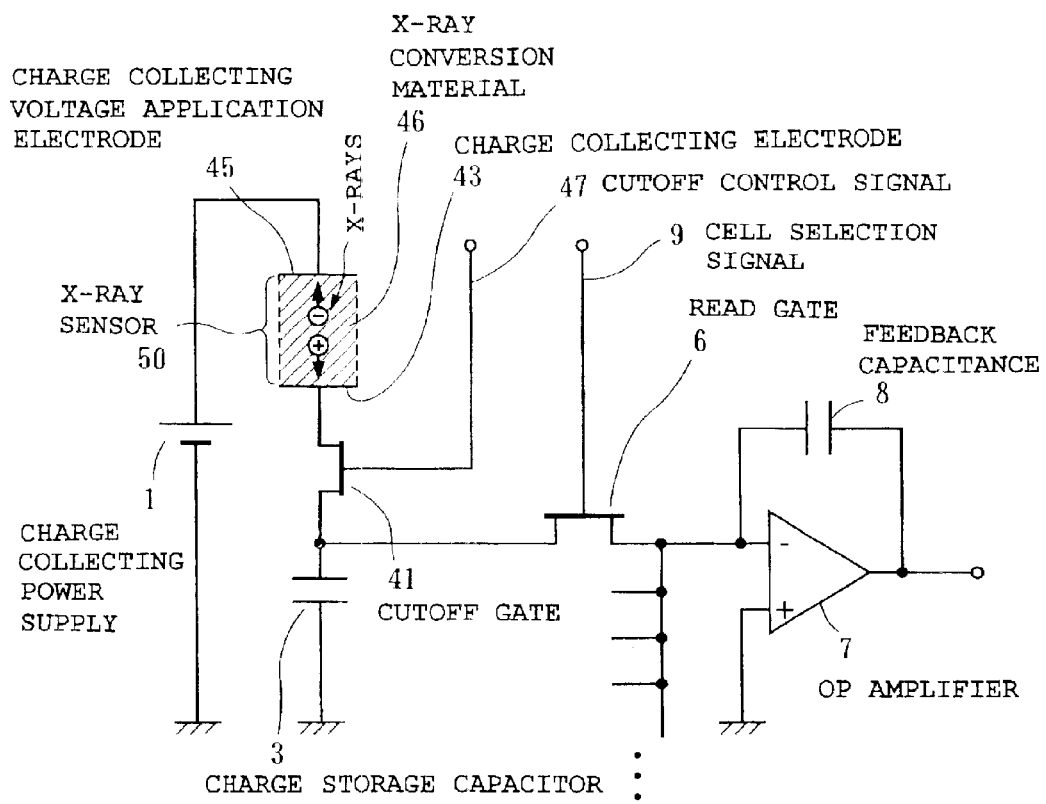
FIG. 8 is an equivalent circuit diagram of a pixel cell and a read amplifier according to Embodiment 4 of the present invention.

FIG. 8 is an equivalent circuit diagram of a pixel cell and the read amplifier 35 connected to this pixel cell. In FIG. 8, reference numeral 1 denotes a charge collecting power supply to collect the charge generated in the X-ray conversion semiconductor layer into the charge collecting electrode 43; 50, an X-ray sensor; 3, a charge storage capacitor.

The X-ray sensor 50 is constructed of a pair of opposite electrodes made up of a charge collecting voltage application electrode 45 and charge collecting electrode 43, and an X-ray conversion material 46 inserted between the pair of these opposite electrodes. X-rays passing through the X-ray conversion material 46 generates pairs of electron and positive hole inside the material 46 and any one of these pairs reaches the charge collecting electrode 43.

Reference numeral 7 denotes an OP amplifier and reference numeral 8 denotes a feedback capacitance, and the OP amplifier and feedback capacitance convert the charge collected through the read gate 6 into the storage electrode capacitor 3 to a voltage signal, which becomes an output signal according to the amount of X-rays absorbed.

The gate terminal of a cutoff gate 41 of each pixel cell is connected to a cutoff voltage control circuit 44 and a signal 47 of this cutoff voltage control circuit 44 is set to a value lower than the breakdown voltage of the read gate 6.

On the other hand, the potential of the read gate 6 on the read amplifier side is almost fixed to about the ground potential and a voltage almost equivalent to the voltage applied to the storage charge capacitor 3 is applied between the source and drain of the read gate 6.

When the charge stored in the charge storage capacitor 3 increases through irradiation of X-rays, the output potential of this capacitor increases. If the output potential of this capacitor exceeds a point of the potential resulting from subtracting a threshold voltage of the cutoff gate 41 from the potential of the cutoff control signal 47 supplied from the cutoff voltage control circuit 44 to each pixel cell, the cutoff gate 41 is turned OFF, which interrupts the path from the X-ray sensor section 50 to the charge storage capacitor 3.

This prevents charge collected from the X-ray sensor section 50 thereafter from being stored in the charge storage capacitor 3.

Therefore, if the threshold voltage of the cutoff gate 41 is ignored, the voltage applied between the source and drain of the read gate 6 is suppressed to about the level of the cutoff control signal 47, which prevents the read gate from being destroyed by excessive irradiation of X-rays. Strictly speaking, the cutoff gate turns to be equivalent to a capacitor after the cutoff gate 41 is interrupted, and therefore the output potential of the charge storage capacitor 3 continues to increase by the charge generated by the X-ray sensor section after the interruption. However, if the equivalent capacitance value of the cutoff gate 41 is very small compared to the capacitance value of the charge storage capacitor 3, the rate of this potential increase is as small as practically negligible.

In this embodiment, the MIS transistor making up the cutoff gate 41 can have the same structure as that of the read gate 6 and can therefore be created in the same manufacturing process and there is no need to make a change or addition to the process in displaying this effect.

In the case where the X-ray conversion material 46 in the X-ray sensor 50 is lead iodide ($PbI_2$), a voltage as low as no more than 100 V needs to be applied to the charge collecting power supply 1 to make it possible to collect the charge generated. Since the withstand voltage between the source and drain of a TFT gate manufactured in the process used for a liquid crystal display, etc. normally ranges from several tens to 100 V, it is possible to operate both the cutoff gate 3 and the read gate 2 with a voltage not greater than a breakdown voltage when the charge collecting power supply 1 is set to about 100 V and the potential of the cutoff control signal 47 is set to about 50 V in this embodiment.

(Embodiment 5)

Figure 9:
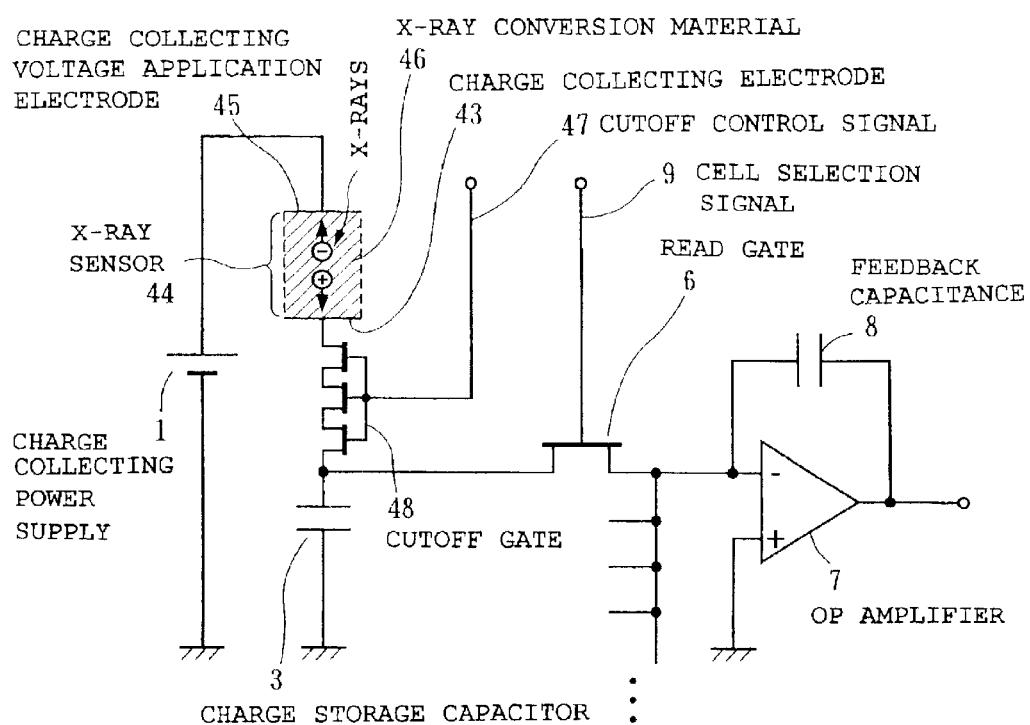
FIG. 9 is an equivalent circuit diagram of a pixel cell and a read amplifier according to Embodiment 5 of the present invention.

FIG. 9 shows an equivalent circuit diagram of a pixel cell and a read amplifier of an array type X-ray detection apparatus according to Embodiment 5 of the present invention. A configuration and basic operation of the X-ray detection apparatus in this embodiment are basically the same as those of Embodiment 4.

As opposed to Embodiment 4 in which the cutoff switch is a MIS transistor 41 having a single gate, the cutoff switch in this embodiment is constructed of a multi-gate MIS transistor 48. The rest of the configuration is the same as that of Embodiment 4.

As described above, while the multi-gate MIS transistor maintains characteristics equivalent to those of a normal single-gate MIS transistor, its channel leakage current decreases drastically. In FIG. 8, if a leakage current occurs at the cutoff gate while the cutoff gate 41 is interrupted, charge is further stored in the charge storage capacitor 3. As a result, the output potential of this capacitor increases.

For this reason, even if the cutoff gate 41 continues to operate, a high voltage may be applied to the read gate 6 leading the read gate 6 to a point of destruction.

This embodiment therefore constructs the cutoff gate 48 with multi-gates and reduces leakage current and thereby reduces the possibility of destruction of the read gate to improve reliability of the apparatus.

As described above, it is further possible to construct the TFT with multi-gates in the amorphous TFT manufacturing process with a minimal addition of area. As in the case of Embodiment 4, the same device structure as that of the read gate 6 can be used in this case, and therefore these two devices can be manufactured in the same manufacturing process, requiring no change or addition to the process. Furthermore, it is possible to obtain effects similar to those in Embodiment 4, that is, it is possible to freely set a cutoff voltage according to various conditions.

As shown above, according to the embodiments of the present invention, X-rays irradiated by the charge converting means are converted to charge and this charge is stored in the charge storing means and read out by the charge transferring means after a certain lapse of time and converted to an electric signal according to the amount of X-rays irradiated. The potential of the charge storing means is limited by the output controlling means or cutoff switch and this potential can be set arbitrarily by the potential setting means.

The output limiting means prevents the charge transferring means from being exposed to an excessive voltage by clamping the output potential of the charge storing means before the amount of charge enough to destroy the charge transferring means is stored in the charge storing means due to irradiation of X-rays. The potential limited by the output limiting means is set to an arbitrary value by the potential setting means.

Furthermore, the cutoff switch prevents the charge transferring means from being exposed to an excessive voltage by interrupting the inflow of charge from the charge converting means to the charge storing means before the amount of charge enough to destroy the charge transferring means is stored in the charge storing means due to irradiation of X-rays. The potential at which the cutoff switch operates can be set to an arbitrary value by the potential setting means.

Normally, the parts of the X-ray detection apparatus other than the charge converting means can be manufactured in the TFT manufacturing process, but the output controlling mans or cutoff switch can be realized with the same device structure as that of the charge transferring means, and therefore there is no need for an addition of a special manufacturing process or change to the X-ray detection apparatus.

Furthermore, when lead iodide is used for the charge converting means, the charge collecting voltage has a withstand voltage equivalent to that of the device manufactured in a normal amorphous silicon TFT manufacturing process, and therefore it is possible to reduce the possibility of the cutoff switch or read gate being destroyed by a charge collecting voltage applied to the charge converting means by means of an appropriate control of a clamp voltage or a cutoff control voltage.

Note that the X-ray dose detection device of the present invention corresponds to the pixel cell of the embodiments, the reading means corresponds to the read amplifier 105 of the embodiments, the potential setting means of the present invention corresponds to the device that applies a voltage to the clamp signal line 5 in the embodiments, the charge transferring means of the present invention corresponds to the read gate 6 of the embodiments, the output limiting means of the present invention corresponds to the diode 4, clamp signal line 5, MIS diode (transistor) 10, multi-gate MIS transistors 20 to 22, and the cutoff switch of the present invention corresponds to the cutoff gates 41 and 48.

INDUSTRIAL APPLICABILITY

The present invention prevents the charge transferring means from being exposed to an excessive voltage by bypassing or interrupting the inflow of charge from the charge converting means to the charge storing means before the amount of charge enough to destroy the charge transferring means is stored in the charge storing means due to irradiation of X-rays and allows the output limiting means and cutoff switch to be provided in the apparatus without the need for an addition of a special manufacturing process or change to the X-ray detection apparatus.

What is claimed is:

1. An array type X-ray detection apparatus comprising:
a plurality of X-ray dose detection devices arranged in a two-dimensional array;
reading means of reading from said plurality of X-ray dose detection devices; and
potential controlling means of controlling a reference potential to protect said plurality of X-ray dose detection devices and/or said reading means,
wherein said plurality of X-ray dose detection devices comprises:
charge converting means of converting incident X-rays to charge;
charge storing means of storing said charge;
charge transferring means of transferring the charge stored in said charge storing means to said reading means; and
output limiting means of practically limiting the output potential produced by the charge stored in said charge storing means to said reference potential or below,
wherein said output limiting means comprises a PN junction diode, where one end of said PN junction diode is connected to said potential controlling means such that a potential of said one end is controlled to be said reference potential.

2. An array type X-ray detection apparatus comprising:
a plurality of X-ray dose detection devices arranged in a two-dimensional array;
reading means of reading from said plurality of X-ray dose detection devices; and
potential controlling means of controlling a reference potential to protect said plurality of X-ray dose detection devices and/or said reading means,
wherein said plurality of X-ray dose detection devices comprises:
charge converting means of converting incident X-rays to charge;
charge storing means of storing said charge;
charge transferring means of transferring the charge stored in said charge storing means to said reading means; and
output limiting means of practically limiting the output potential produced by the charge stored in said charge storing means to said predetermined reference potential or below, and
wherein said output limiting means comprises a first MIS transistor whose gate terminal and drain terminal are connected to each other, wherein a source terminal of said first MIS transistor is connected to said potential controlling means such that a potential of said source terminal is controlled to be said reference potential.

3. The array type X-ray detection apparatus according to claim 2, wherein said charge transferring means comprises a second MIS transistor and said first MIS transistor and said second MIS transistor are formed in the same process.

4. The array type X-ray detection apparatus according to claim 2, wherein said first MIS transistor has a multi-gate structure.

5. The array type X-ray detection apparatus comprising:
a plurality of X-ray dose detection devices arranged in a two-dimensional array;
reading means of reading from said plurality of X-ray dose detection devices; and
potential setting means of setting a predetermined reference voltage to protect said plurality of X-ray dose detection devices and/or said reading means,
wherein said plurality of X-ray dose detection devices comprises:
charge converting means of converting incident X-rays to charge;
charge storing means of storing said charge;
charge transferring means of transferring the charge stored in said charge storing means to said reading means; and output limiting means of practically limiting the output potential produced by the charge stored in said charge storing means to said predetermined reference potential or below, and wherein said output limiting means is a cutoff switch placed between said charge converting means and said charge storing means, said charge transferring means transfers charge between said cutoff switch and said charge storing means, and said cutoff switch opens and closes in such a way that the output potential produced by the charge stored in said charge storing means is practically limited to a predetermined reference potential or below.

6. The array type X-ray detection apparatus according to claim 5, wherein said cutoff switch is a third MIS transistor and the potential of the gate of said third MIS transistor is set from said potential setting means.

7. The array type X-ray detection apparatus according to claim 6, wherein said charge transferring means is a fourth MIS transistor and said fourth transistor and said third MIS transistor are formed in the same process.

8. The array type X-ray detection apparatus according to claim 6 or claim 7, wherein said third MIS transistor has a multi-gate structure.

9. The array type X-ray detection apparatus according to claim 1, 2 or claim 5, wherein a charge conversion material making up said charge converting means includes at least metal iodide.

* * * * *